United States Patent
Chung et al.

(10) Patent No.: US 6,280,907 B1
(45) Date of Patent: Aug. 28, 2001

(54) PROCESS FOR FORMING POLYMER THICK FILM RESISTORS AND METAL THIN FILM RESISTORS ON A PRINTED CIRCUIT SUBSTRATE

(75) Inventors: Chia-Tin Chung, Miaoli Hsien; Bin-Yuan Lin, Hsinchu Hsien; Wun-Ku Wang; Wei-Chun Yang, both of Taipei; Hsin-Herng Wang, Hsichu; Te-Yeu Su, Hualien, all of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/343,514

(22) Filed: Jun. 30, 1999

(30) Foreign Application Priority Data

Jun. 3, 1999 (TW) .................................. 88109200

(51) Int. Cl.$^7$ ....................................... G03F 7/00
(52) U.S. Cl. ........................................... 430/313; 430/315
(58) Field of Search ..................... 430/313, 315

(56) References Cited

U.S. PATENT DOCUMENTS 4,963,389 * 10/1990 Takada et al. ........................... 427/98
5,624,782 * 4/1997 Hayakawa et al. ................... 430/198

* cited by examiner

Primary Examiner—John S. Chu
(74) Attorney, Agent, or Firm—Sughrue, Mion, Zinn, Macpeak & Seas, PLLC

(57) ABSTRACT

A process is disclosed for forming resistors on a printed circuit substrate. The method includes the step of applying a photoresist layer onto substrate, and forming openings in the photoresist layer to expose the preselected regions for resistors, such that polymer thick resist pastes as well as resistive metallic films can be applied onto the substrate through these openings with precise geometry. The process according to the invention has higher accuracy and greater processing flexibility than the prior art processes where the resistor pastes are directly applied onto the substrate by screen printing.

10 Claims, 2 Drawing Sheets

PROCESS FOR FORMING POLYMER THICK FILM RESISTORS AND METAL THIN FILM RESISTORS ON A PRINTED CIRCUIT SUBSTRATE

BACKGROUND OF THE INVENTION

1. Field of the Invention

The present invention relates in general to a process for forming resistors on a printed circuit board. More particularly, it relates to a process by which polymer thick film resistors and metal thin film resistors can be successively produced on the same layer of a printed circuit substrate.

2. Description of the Related Arts

The density of components and conductor circuits placed on printed circuit boards has been increasing in response to the need to accommodate increasingly complex electronic circuitry in smaller spaces. In addition to accommodating a greater number of conductor paths than heretofore, many printed circuit boards being manufactured today have a greater number of discrete components mounted thereon. Frequently, electronic circuits contained on printed circuit boards require a very large number of resistors to perform various functions, for example, terminating circuits. Heretofore, in most instances such terminations were required to be made by mounting resistors on the surface of a circuit board and connecting the resistors to conductors through holes which passed from the board's surface through one or more conductor planes to the conductor paths to which the resistors are to be connected- Resistors used to accomplish such terminating function could be either conventional carbon composition resistors or resistors screened onto the circuit board's top surface using polymer thick film (PTF) resistive pastes. In the event that surface mounting of the resistors is not suitable, e.g. where resistive terminations are required in a board having many layers and limited surface area, the circuit designer could use a material sold under the name "Ohmega-Ply" by Ohmega Technologies, Inc. The Ohmega-Ply material is composed of a layer of resistive material sandwiched between upper copper conductive layers and lower core material (PR-4 or Polyimide). The Ohmega-Ply material may be used to make resistor-conductor networks using a photolithographic process. The Ohmega-Ply material may be etched using conventional etching processes to produce circuit layers having integral discrete resistors. However, one problem with Ohmega-Ply material which makes it undesirable for use in multilayer printed circuit boards is that it is difficult to produce resistors for a layer whose values substantially differ from each other within the layer, e.g., vary by more than one decade.

U.S. Pat. No. 4,021,277 describes a method of forming a thin resistor film which comprises: depositing by cosputtering a metastable alloy film on a substrate, annealing said resistor film, and determining the geometry of The film by a normal photo-etch process. U.S. Pat. No. 4,368,252 describes a method for manufacturing a printed circuit board with resistance elements, in which a resistor pattern film and a conductor pattern film are formed on the two surfaces of a high conductive material layer such as a copper foil., respectively, and an insulating support is combined with the resistor pattern film on the high conductive material layer. Methods for forming metallic thin film resistors arc described in U.S. Pat. Nos. 4,540,463, 5,039,570, and 4,865, 573. One major drawback with these methods is the incapability of producing resistors of high resistivity. Another method reading to the general subject matter is described in U.S. Pat. No. 4,870,746. The method includes the steps of manufacturing individual layers of the multilayer board with electrical circuits thereon and subsequently screening on one or more values of resistors using a polymer thick film resistive ink. The individual layers are thereafter bonded together into a multilayer board. The forgoing method has the disadvantage that the geometry and thickness of the resistors is difficult to control, resulting in variations in the resistivities.

SUMMARY OF THE INVENTION

An object of the invention is to provide a process for forming polymer thick film resistors on a printed circuit substrate, by which polymer thick film (PTF) resistor pastes having one or more resistivities may be placed on the same layer of the printed circuit board, and the geometry and thickness of the resistors can be precisely controlled.

Another object of the invention is to provide a process for forming polymer thick film resistors and metal thin film resistors on a printed circuit substrate, in which these two kinds of resistors can be successively formed on a printed circuit board.

The foregoing objects are achieved by applying a photoresist layer onto a substrate and forming openings in the photoresist layer to expose the preselected regions for resistors, such that PTF pastes having different resistivities may be filled into these openings by screen printing or dispensing, and resistive metallic films can also be deposited onto the substrate through these openings. In accordance with the present invention, since the geometry and thickness of the resistors can be precisely controlled, the resistance variations caused by dimensional instability can be minimized.

According to an aspect of the invention, the process for forming polymer thick film resistors on a printed circuit substrate comprises the steps of: (a) forming on a substrate a circuit pattern including electrodes which are reserved for resistors; (b) forming a photoresist layer covering the substrate and the circuit pattern; (c) forming one or more openings in the photoresist layer to expose the preselected regions for resistors; (d) filling the openings with polymer thick film resistor pastes having one or more resistivities; (e) curing the resistor pastes; and (f) removing the remaining photoresist layer to leave one or more polymer thick film resistors on the substrate.

According to another aspect of the invention, the process for forming polymer thick film resistors and metal thin film resistors on a printed circuit substrate comprises the steps of: (a) forming on a substrate a circuit pattern including electrodes which are reserved for resistors; (b) forming a photoresist layer covering the substrate and the circuit pattern; (c) forming a plurality of openings in the photoresist layer to expose the preselected regions for resistors; (d) filling at least one of the openings with polymer thick film resistor pastes having one or more resistivities; (e) partially curing the resistor pastes; (f) depositing a resistive metallic film onto the substrate through at least one other openings; (g) completely curing said resistor pastes; and (h) removing the remaining photoresist layer to leave at least one polymer thick film resistor and at least one metal thin film resistor oil the substrate.

Other objects, features, and advantages of the present invention will become apparent from the following detailed description which makes reference to the accompanying drawings.

DESCRIPTION OF THE PREFERRED EMBODIMENTS

Figure 1A:
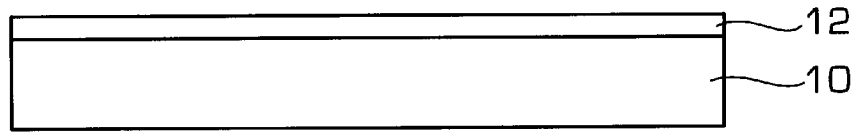
FIGS. 1–1E are cross-sectional views for illustrating the process for forming polymer thick film resistors according to the present invention.
Figure 1B:
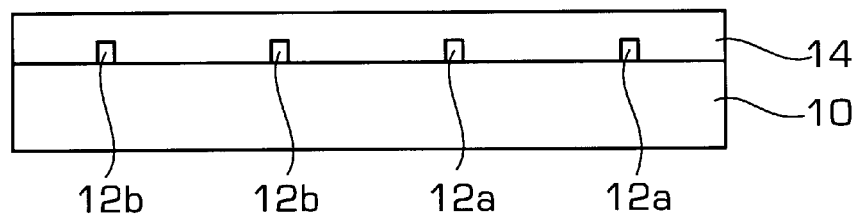
Figure 1C:
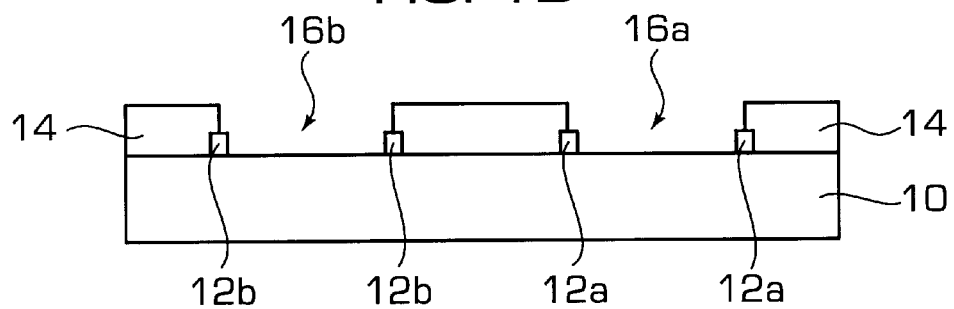

At the outset, the process for forming polymer thick film resistors according to the present invention will be described. Referring initially to FIG. 1A, a conventional printed circuited board 10, such as FR-4, having a copper foil layer 12 on one side is provided. As shown in FIG. 1E, the copper foil layer 12 is etched to leave a conductive pattern including electrodes 12a and 12b to which the resistors of the circuit board are to be mounted. Having etched the copper foil to leave the circuit pattern, a uniform photoresist 14 is coated on the substrate surface, which covers the entire circuit pattern including the electrodes. Referring to FIG. 1C, the photoresist layer is exposed to a source of ultraviolet light through a photomask containing the desired pattern of resistors, and then developed. As a result, the preselected regions for resistors as well as portions of the electrodes 12a and 12b are exposed through the openings 16a and 16b.

Figure 1D:
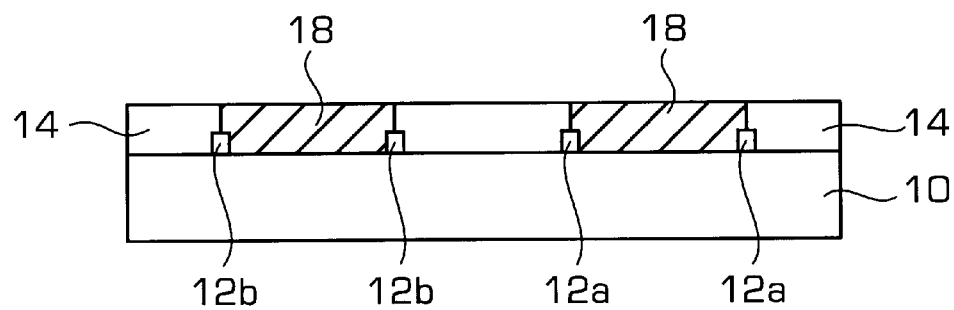
Figure 1E:
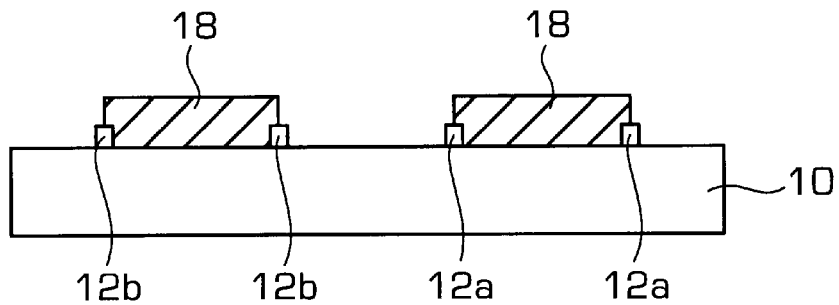

Referring to FIG. 1D, after developing the photoresist, PTF pastes 18 are applied to the openings by either using a screen printer or dispenser. By the latter, PTF pastes with different resistivities may be applied onto the substrate co form resistors having substantially different resistance values. After slightly heating the pastes, the excess is removed by a doctor blade to give a planar surface. Then, the resistor pastes are cured by either heating or irradiating with ultraviolet rays, or a combination thereof, depending on the nature of the resistor pastes. Preferably the resistor pastes used herein are a solventless formulation, which eliminates the dimensional stability problems caused by solvent evaporation. Finally, the remaining photoresist is removed by a removing solution to leave the thick film resistor on the circuit board, as shown in FIG. 1E. As is evident from the foregoing, the geometry and thickness of the final resistors can be precisely controlled by regulating the geometry of the corresponding openings and the thickness of the photoresist layer. Accordingly, the process according to the invention has higher accuracy and greater processing flexibility than the prior art processes where the resistor pastes are directly applied onto the substrate surface by screen printing.

Figure 2A:
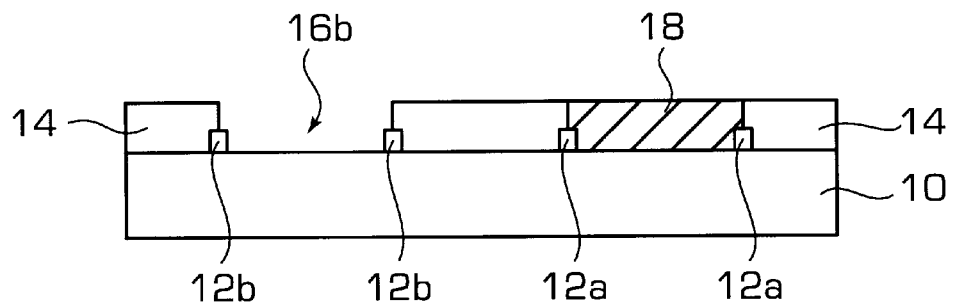
FIGS. 2A–2D are cross-sectional views for illustrating the process for forming polymer thick film resistors and metal thin film resistors according to the present invention.

The process for forming both polymer thick film resistors and metal thin film resistors on a printed circuit substrate according to the invention will now be described in detail. Referring to FIG. 2A, a printed circuit substrate with a copper foil thereon is subjected to the same procedures of copper foil etching, photoresist patterning, and application of resistor pastes as outlined in FIGS. 1A–1D, except that opening 16b is left empty for depositing a resistive metallic film. Before deposition of the metallic film, the applied resistor pastes is exposed to UV radiation for preliminary hardening to assure its integrity during the following processes.

Figure 2B:
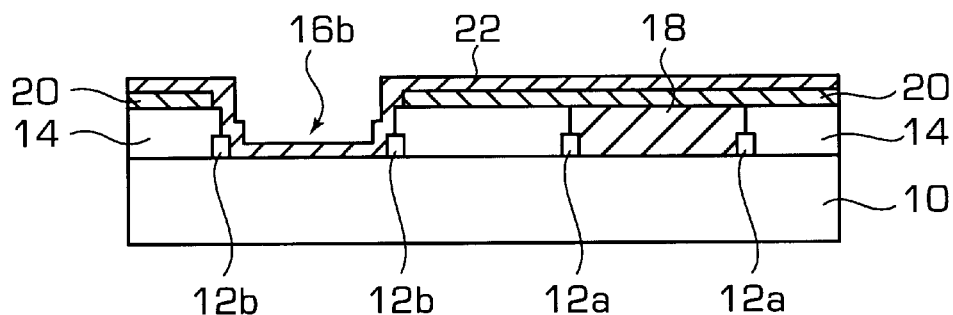
Figure 2C:
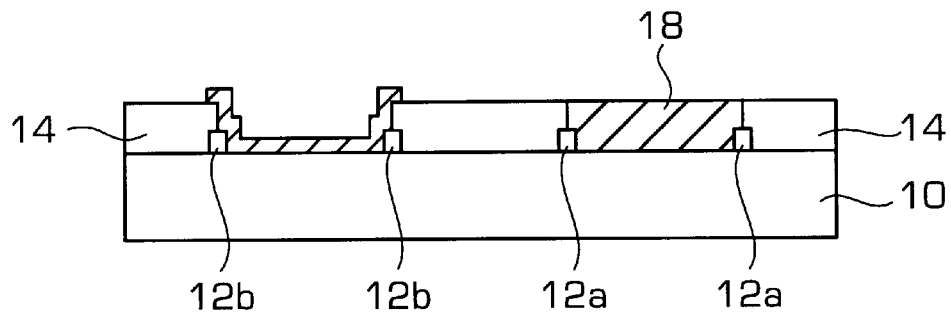
Figure 2D:
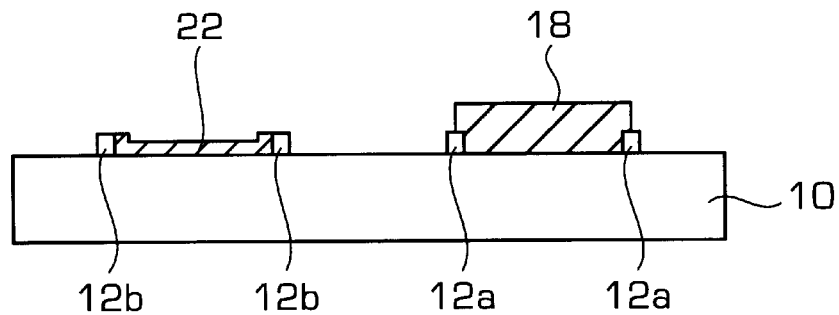

Preferring to FIG. 2B, the surface of the circuit board is covered with a masking film 20 such as a removable adhesive tape, which exposes the regions where the metallic film is to be deposited while masking the other portions of the substrate. A thin metallic film 22 is deposited onto the substrate surface through the opening 16b as well as onto the masking film 20. The metallic film can be deposited by any known methods such as vacuum evaporation, sputtering, and electroplating. Referring to FIG. 2C, after the masking film 20 is removed from the substrate, the pastes are fully cured by passing the substrate through an oven, and the metallic film 22 is thereafter annealed. After stripping the remaining photoresist, the printed circuit board 10 incorporating both polymer thick film resistor 18 and metal thin film resistor 22 is obtained as a result.

While the invention has been particularly shown and described with The reference to the preferred embodiment thereof, it will be understood by those skilled in the art that various changes in form and details may be made without departing from the spirit and scope of the invention.

What is claimed is:

1. A process for forming polymer thick film resistors on a printed circuit board, comprising the steps of:
    (a) forming on a substrate a circuit pattern including electrodes which are reserved for resistors;
    (b) forming a photoresist layer covering said substrate and said circuit pattern;
    (c) forming one or more openings in said photoresist layer to expose preselected regions for resistors;
    (d) filling said openings with polymer thick film resistor pastes having one or more resistivities by screen printing or dispensing, and removing the excess resistor pastes by use of a doctor blade, wherein said resistor pastes are of solventless formulation;
    (e) curing said resistor pastes by either heating or irradiating with ultraviolet rays, or a combination thereof; and
    (f) removing the remaining photoresist layer to leave one or more polymer thick film resistors on the substrate.

2. A process for forming polymer thick film resistors and metal thin film resistors on a printed circuit board, comprising the steps of:
    (a) forming on a substrate a circuit pattern including electrodes which are reserved for resistors;
    (b) forming a photoresist layer covering said substrate and said circuit pattern;
    (c) forming a plurality of openings in said photoresist layer to expose the preselected regions for resistors;
    (d) filling at least one of the openings with polymer thick film resistor pastes having one or more resistivities;
    (e) partially curing said resistor pastes;
    (f) depositing a resistive metallic film onto the substrate through at least one other opening;
    (g) completely curing said resistor pastes; and
    (h) removing the remaining photoresist layer to leave at least one polymer thick film resistor and at least one metal thin film resistor on said substrate.

3. The process as claimed in claim 2, wherein said resistor pastes are filled into said opening by screen printing or dispensing.

4. The process as claimed in claim 3, wherein said step (d) further comprises removing the excess resistor pastes by use of a doctor blade.

5. The process as claimed in claim 2, wherein said resistor pastes are a solventless formulation.

6. The process as claimed in claim 2, wherein said resistor pastes are cured by either heating or irradiating with ultraviolet rays, or a combination thereof.

7. The process as claimed in claim 2, wherein said step (f) comprises:
    providing a masking film over said substrate, said masking film exposing the regions of the metallic film to be deposited while masking the other portions of the substrate;
    depositing a resistive metallic film onto the substrate; and
    removing said mask film.

8. The process as claimed in claim 2, wherein said a resistive metallic film is deposited by electroplating, sputtering, or evaporation.

9. The process as claimed in claim 2, wherein said resistor pastes are completely cured by heating.

10. The process as claimed in claim 2, further comprising a step of annealing said resistive metallic film prior to remove the remaining photoresist layer.

* * * * *